United States Patent [19]
Gill

[11] Patent Number: 6,108,177
[45] Date of Patent: Aug. 22, 2000

[54] TUNNEL JUNCTION STRUCTURE WITH FEX FERROMAGNETIC LAYERS

[75] Inventor: Hardayal Singh Gill, Portola Valley, Calif.

[73] Assignee: International Business Machines Corporation, Armonk, N.Y.

[21] Appl. No.: 09/196,469

[22] Filed: Nov. 19, 1998

[51] Int. Cl.[7] .................................................. G11B 5/39
[52] U.S. Cl. ............................. 360/324.12; 360/324.2; 365/158
[58] Field of Search ........................ 360/113, 324.12, 360/324.2, 126; 365/158; 324/252

[56] References Cited

U.S. PATENT DOCUMENTS

| | | | |
|---|---|---|---|
| 5,390,061 | 2/1995 | Ryoichi et al. .................. | 360/113 |
| 5,629,922 | 5/1997 | Moodera et al. ................ | 369/126 |
| 5,636,093 | 6/1997 | Gijs et al. ...................... | 360/126 |
| 5,650,958 | 7/1997 | Gallagher et al. ................ | 365/173 |
| 5,654,566 | 8/1997 | Johnson ......................... | 257/295 |
| 5,708,358 | 1/1998 | Ravipati ......................... | 324/252 |
| 5,828,598 | 10/1998 | Chen et al. ..................... | 365/158 |
| 5,986,858 | 11/1999 | Sato et al. ..................... | 360/113 |
| 6,022,633 | 2/2000 | Hayashi et al. ................. | 428/692 |

FOREIGN PATENT DOCUMENTS

11-110720  4/1999  Japan .

*Primary Examiner*—Jefferson Evans
*Attorney, Agent, or Firm*—Gray Cary Ware & Freidenrich LLP; Ervin F. Johnston

[57] ABSTRACT

A tunnel junction sensor utilizes a FeX ferromagnetic alloy that has high saturation flux density and low coercivity. In a preferred embodiment, the FeX ferromagnetic alloy is iron nitride (FeN).

73 Claims, 5 Drawing Sheets

TUNNEL JUNCTION STRUCTURE WITH FEX FERROMAGNETIC LAYERS

BACKGROUND OF THE INVENTION

1. Field of the Invention

The present invention relates to a tunnel junction structure used as a tunnel junction sensor in a magnetic head and more particularly to a tunnel junction sensor with FeX as the ferromagnetic layers.

2. Description of the Related Art

A read head employing a read sensor may be combined with an inductive write head to form a combined magnetic head. In a magnetic disk drive, an air bearing surface (ABS) of the combined magnetic head is supported adjacent a rotating disk to write information on or read information from the disk. Information is written to the rotating disk by magnetic fields which fringe across a gap between the first and second pole pieces of the write head. In a read mode, the resistance of the read sensor changes proportionally to the magnitudes of the magnetic fields from the rotating disk. When a current is conducted through the read sensor, resistance changes cause potential changes that are detected and processed as playback signals in processing circuitry.

A read sensor is employed by a magnetic head for sensing magnetic fields from moving magnetic media, such as a magnetic disk or a magnetic tape. The sensor includes a nonmagnetic conductive layer, hereinafter referred to as a spacer layer, sandwiched between first and second ferromagnetic layers, hereinafter referred to as a pinned layer, and a free layer. The magnetization of the pinned layer is pinned 90° to the magnetization of the free layer and the magnetization of the free layer is free to respond to external magnetic fields. The magnetization of the pinned layer is typically pinned by exchange coupling with an antiferromagnetic layer.

One type of read sensor employs a tunnel junction sensor. The tunnel junction sensor is a device comprised of two ferromagnetic layers (i.e., the pinned and free layers) separated by a thin insulating spacer layer and is based on the phenomenon of spin-polarized electron tunneling. The typical tunnel junction sensor uses free and pinned layers, such as NiFe or CoFe, with a spacer layer therebetween that is thin enough that quantum mechanical tunneling occurs between the free and pinned layers. The tunneling phenomenon is electron spin dependent, making the magnetic response of the tunnel junction sensor a function of the relative orientations and spin polarization of the conduction electrons between the free and pinned layers. The details of tunnel junction structures have been described in the commonly assigned U.S. Pat. No. 5,650,958 to Gallagher et al., which is incorporated by reference herein.

While it is known that ferromagnetic metals, such as CoFe, provide high Tunnel Magnetoresistance Ratio (TMR) due to their high spin polarization, it is also known that spin polarization of ferromagnetic metals is proportional to their magnetic moments ($M_S$). These ferromagnetic metals are not a suitable metal for tunnel junction head applications due to their high coercivity ($H_C$). Cobalt iron (CoFe) has a $M_S$ of 1400–1600 emu/cc, depending on the composition of the material, and a $H_C$ greater than 20 Oe.

From the above it becomes apparent that what is needed is a material for use as pinned and free layers in a tunnel junction structure having high saturation flux density with low coercivity.

SUMMARY OF THE INVENTION

The present invention is directed to a tunnel junction structure using a FeX ferromagnetic alloy material as the pinned and free layers, the FeX material having a high saturation flux density and low coercivity. The high saturation flux density equates to high spin polarization and therefore, high Tunnel Magnetoresistance Ratio (TMR). The ferromagnetic alloy disclosed in the present invention for use as the pinned and free layer is FeN (iron nitride).

The preferred embodiment of the tunnel junction sensor includes a first shield layer made of Pennalloy. An optional protection layer of tantalum (Ta) and optional seed layer of nickel iron (NiFe) are used between the first shield layer and an antiferromagnetic pinning layer, the pinning layer being made of manganese iron (MnFe). The pinned layer is made of iron nitride (FeN), whose magnetic moment is pinned by exchange coupling with the antiferromagnetic pinning layer. Iron nitride (FeN) has a $M_S$ of 1600 emu/cc and a $H_C$ of less that 5 Oe. To assist in the exchange coupling between the MnFe and the FeN layers, a thin interface layer made of nickel iron (NiFe) is positioned therebetween. The reason for the interface layer is that the MnFe pinning layer has stronger exchange coupling with the NiFe interface layer than with the FeN pinned layer. A spacer layer, made of aluminum oxide, is positioned between the pinned layer and a free layer. The free layer is made of iron nitride (FeN) with a desired magnetization direction perpendicular to that of the pinned layer magnetization (i.e., parallel to the ABS). An optional protection layer, made of tantalum (Ta), is placed between the free layer and a second shield layer. The protection layer is used to prevent magnetic coupling between the free layer and the second shield layer.

The first and second shield layers are used as electrodes for the tunnel junction sensor. A tunneling current $I_T$ flows through the tunnel junction sensor, perpendicular to the plane of the films or layers. The amount of current $I_T$ that flows through is dependent on the relative magnetic moment directions of the pinned layer and the free layer and their magnetic moments. As the tunnel junction sensor is positioned over a rotating magnetic disk, external magnetic fields sensed from the rotating disk moves the direction of magnetic moment of the free layer up or down, changing the resistance through the tunnel junction sensor. As the direction of the magnetic moment of the free layer rotates up from the ABS (i.e., going toward the opposite direction of a downwardly directed magnetic moment of the pinned layer), the amount of electron tunneling decreases (i.e., the resistance increases). As the direction of the magnetic moment of the free layer rotates down toward the ABS (i.e., going toward the same direction as the magnetic moment of the pinned layer) the amount of electron tunneling increases (i.e., the resistance decreases). As the tunnel current $I_T$ is conducted through the sensor, the increase and decrease of electron tunneling (i.e., increase and decrease in resistance) are manifested as potential changes. These potential changes are then processed as readback signals by the processing circuitry of the disk drive.

Other objects and advantages of the present invention will become apparent upon reading the following description taken together with the accompanying drawings.

DESCRIPTION OF THE PREFERRED EMBODIMENTS

Magnetic Disk Drive

Figure 1:
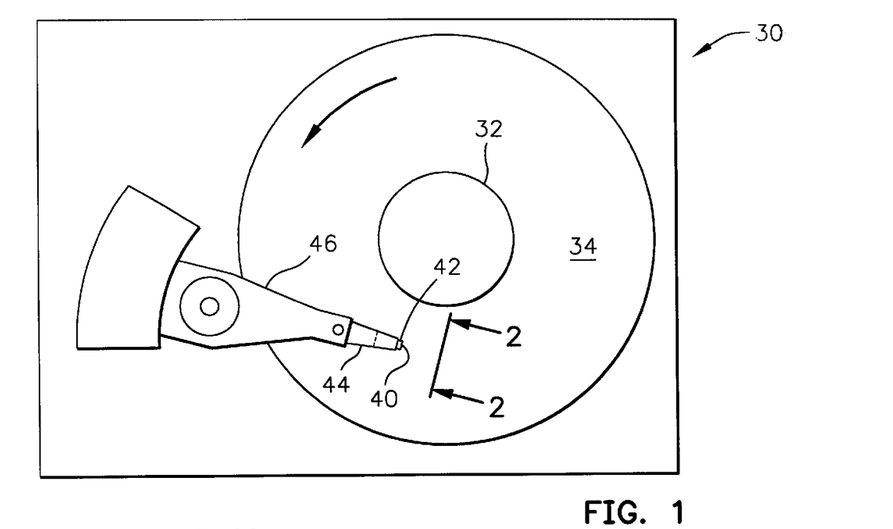
FIG. 1 is a plan view of an exemplary magnetic disk drive.
Figure 2:
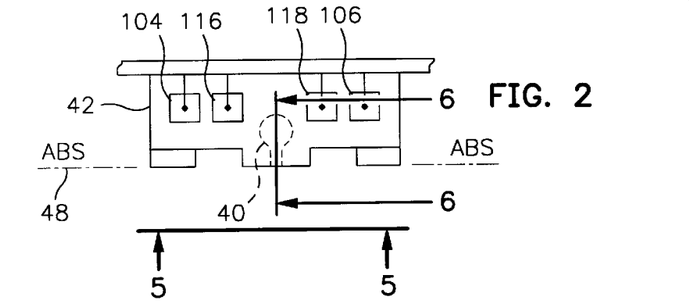
FIG. 2 is an end view of a slider with a magnetic head as seen in plane 2—2 of FIG. 1.
Figure 3:
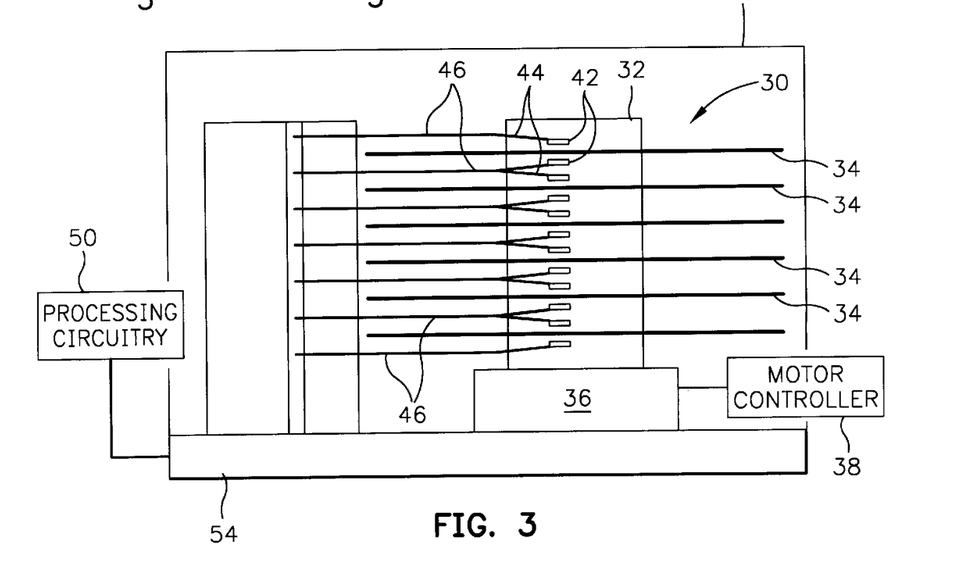
FIG. 3 is an elevation view of the magnetic disk drive wherein multiple disks and magnetic heads are employed.
Figure 4:
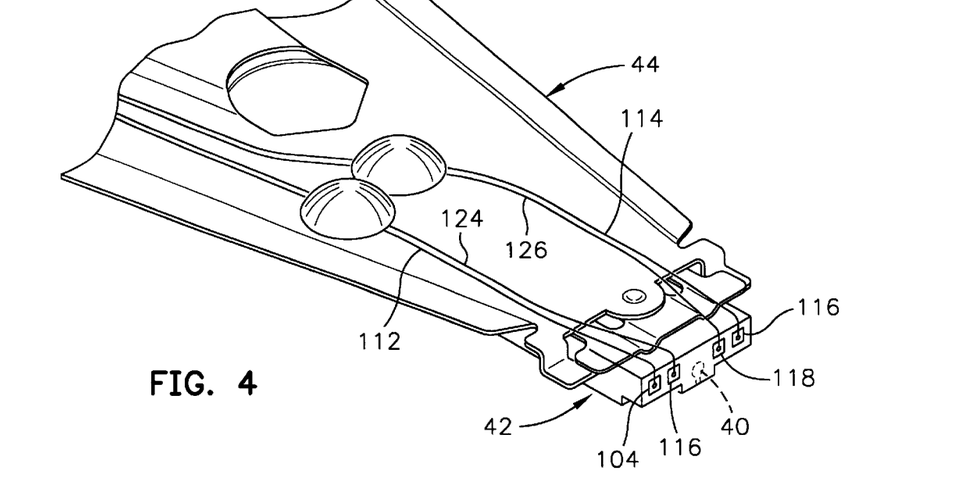
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a motor 36 that is controlled by a motor controller 38. A combined read and write magnetic head (merged read/write head) 40 is mounted on a slider 42 that is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 $\mu$m) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various circular tracks on the disk. FIG. 4 shows the mounting of the slider 42 to the suspension 44, which will be described hereinafter. The components described hereinabove may be mounted on a frame 54 of a housing 55, as shown in FIG. 3.

Figure 5:
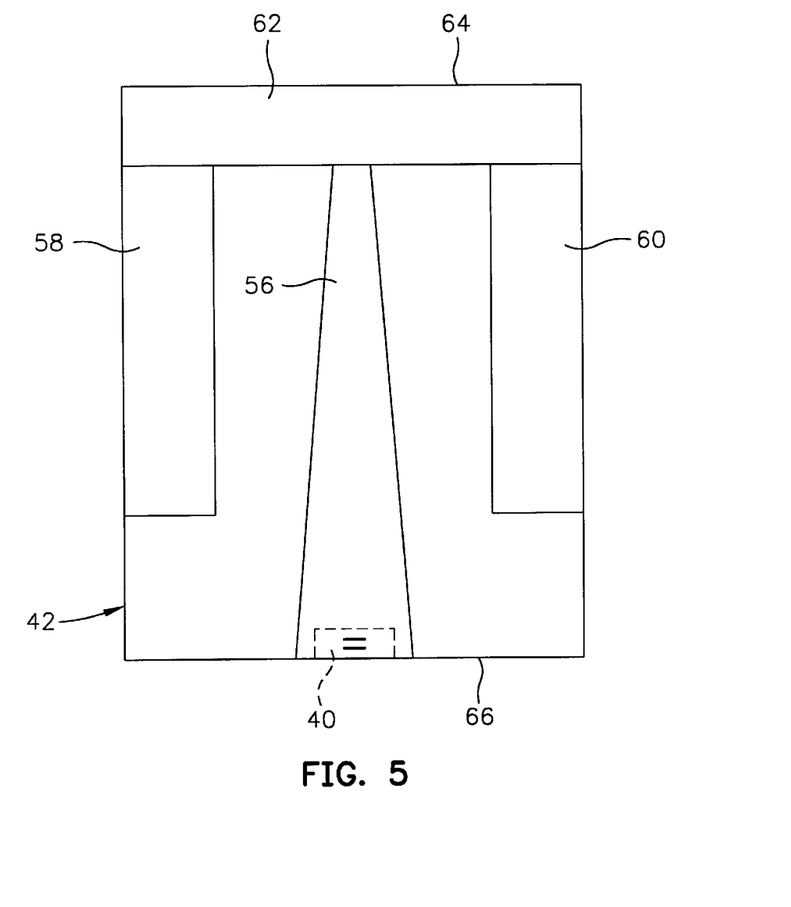
FIG. 5 is an ABS view of the slider taken along in plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figures 6, 7, 8:
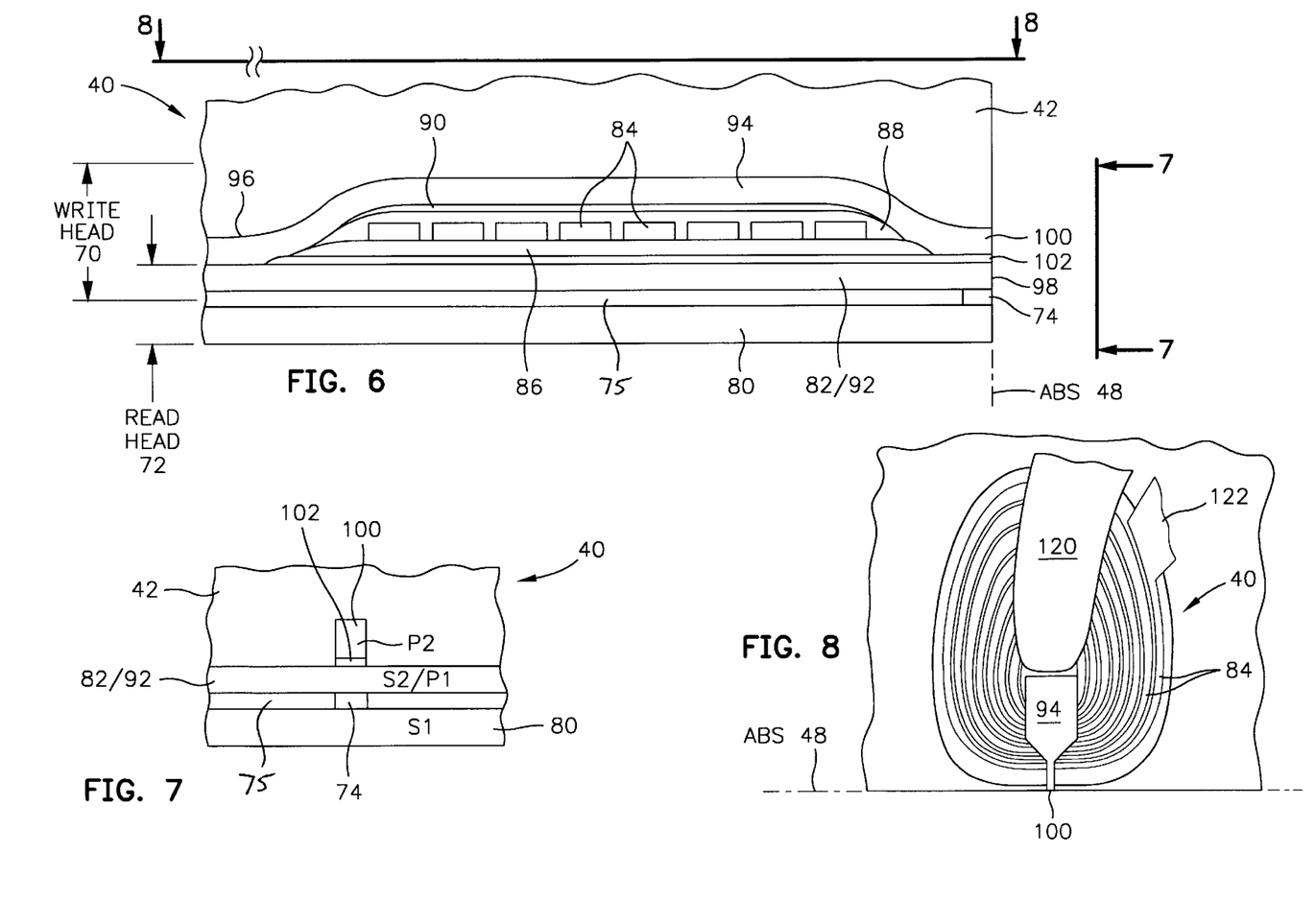
FIG. 6 is side view of a front portion of the magnetic head as seen in plane 6—6 of FIG. 2.
FIG. 7 is a partial ABS view of the slider taken along plane 7—7 of FIG. 6 to show the read and write elements of the magnetic head.
FIG. 8 is a view taken along plane 8—8 of FIG. 6 with all material above the coil layer and its leads removed.

FIG. 6 is a cross-sectional elevation side view of a front portion of the merged MR head 40, which includes a write head portion 70 and a read head portion 72, the read head portion employing a tunnel junction sensor 74 of the present invention. FIG. 7 is an ABS view of FIG. 6. The sensor 74 and insulating gap layer 75 are sandwiched between first and second shield layers 80 and 82. The insulating gap layer 75 insulates the shields from each other and may be made from aluminum oxide, aluminum nitride or silicone dioxide. In response to external magnetic fields from the rotating disk, the resistance of the tunnel junction sensor 74 changes. To determine the resistance, a tunneling current $I_T$ is used. The first and second shield layers 80 and 82 are employed as leads. In the tunnel junction the current flows through all the layers of the tunnel junction between the leads (i.e., first and second shields). As the free layer rotates in response to the magnetic field from the disk, the resistance of the tunnel junction structure changes, altering the current through the structure. These resistance changes are manifested as potential changes. These potential changes are then processed as readback signals by the processing circuitry 50 shown in FIG. 3.

The write head portion of the merged MR head includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. As shown in FIGS. 2 and 4, first and second solder connections 104 and 116 connect leads from the tunnel junction sensor 74 to leads 112 and 124 on the suspension 44, and third and fourth solder connections 118 and 116 connect leads 120 and 122 from the coil 84 (see FIG. 8) to leads 126 and 114 on the suspension.

Present Invention

Figure 9:
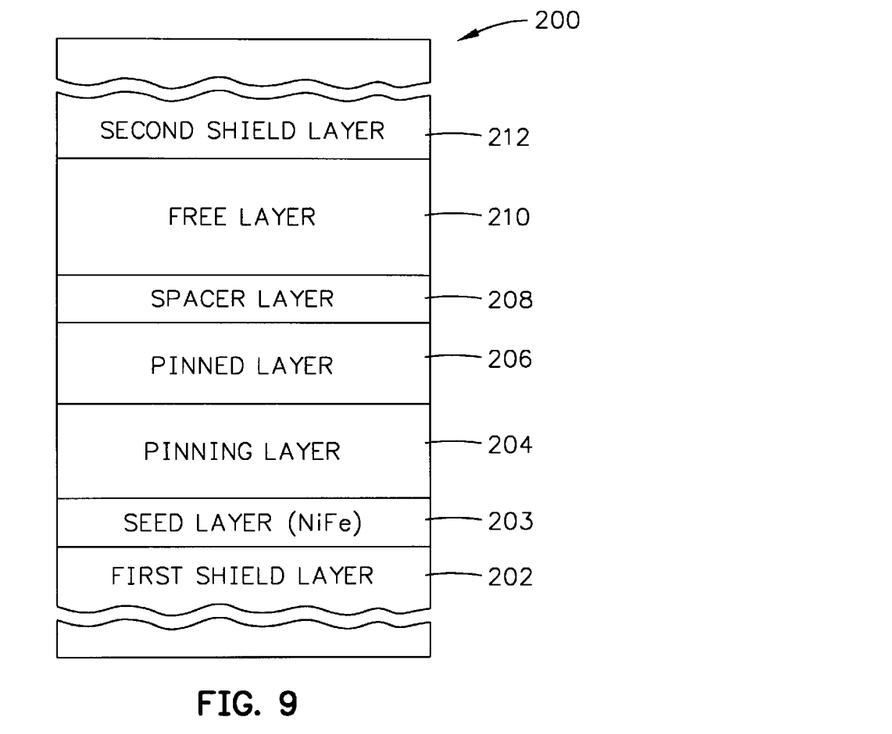
FIG. 9 is an air bearing surface (ABS) illustration of the sensor of the present invention.

FIG. 9 shows one embodiment of the tunnel junction sensor 200 of the present invention which includes a first shield 202, a seed layer 203, a pinning layer 204, a pinned layer 206, a spacer layer 208, a free layer 210 and a second shield layer 212. The first and second shields 202 and 212 are made from a conductive material, such as Permalloy which is $Ni_{80}Fe_{20}$. The seed layer 203, if necessary, is made from nickel iron (NiFe) having a thickness of 10–20 Å. The pinning layer 204 is made of manganese iron (MnFe). The pinning layer may also be made of NiMn, IrMn or PtMn. The pinned layer 206 is made from a ferromagnetic material that has a high saturation flux density and low coercivity, such as iron nitride (FeN), cobalt (Co) or cobalt iron (CoFe). The pinned layer 206 is exchange coupled to the pinning layer 204. The spacer layer 208 may be made of aluminum oxide. The free layer 210 is made from iron nitride (FeN) which has a high saturation flux density ($M_S$) of 1600 emu/cc and low coercivity ($H_C$) of less than 2 Oe. While the above description is a simple layup of the present invention, there are other layers that may be added to improve the tunnel junction sensor.

Figure 10:
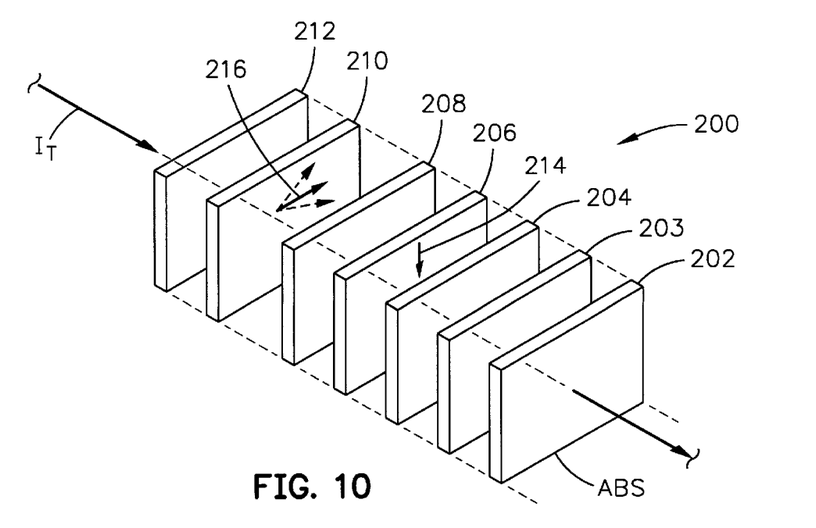
FIG. 10 is an exploded view of FIG. 9.

FIG. 10 is an exploded view of FIG. 9 showing the layers and orientation of the magnetic moment 214 of the pinned layer 206 and the magnetic moment 216 of the free layer 210. The magnetic moment 214 of the pinned layer 206 is in a downward or upward direction perpendicular to the ABS, the direction of the magnetic moment 214 being pinned by interfacial exchange coupling with the adjacent pinning layer 204. The magnetic moment 216 of the free layer 210 is perpendicular to the magnetic moment 214 of the pinned layer 206 (i.e., the moment direction is parallel to the ABS). A tunneling current $I_T$, using spin dependent electron tunneling, flows through the tunnel junction sensor 200, perpendicular to the ABS, with the first and second shield layers 202 and 212 used as leads. The amount of current $I_T$ that flows through the sensor is dependent on the relative magnetic moment directions 214 and 216 of the pinned layer 206 and the free layer 210. As the tunnel junction sensor 200 is positioned over the magnetic disk 34, the external magnetic fields sensed from the rotating disk 34 moves the direction of magnetic moment 216 of the free layer 210 up or down, changing the resistance through the tunnel junction sensor 200. As the magnetic moment 216 rotates up from the ABS (i.e., going toward the opposite direction of the magnetic moment 214), the amount of electron tunneling decreases (i.e., the resistance increases). As the magnetic moment 216 rotates down toward the ABS (i.e., going toward the same direction as the magnetic moment 214), the amount of electron tunneling increases (i.e., the resistance decreases). As the tunnel current $I_T$ is conducted through the sensor 200, the increase and decrease of electron tunneling (i.e., increase and decrease in resistance) are manifested as potential changes. These potential changes are then processed as readback signals by the processing circuitry shown in FIG. 3.

Figure 11:
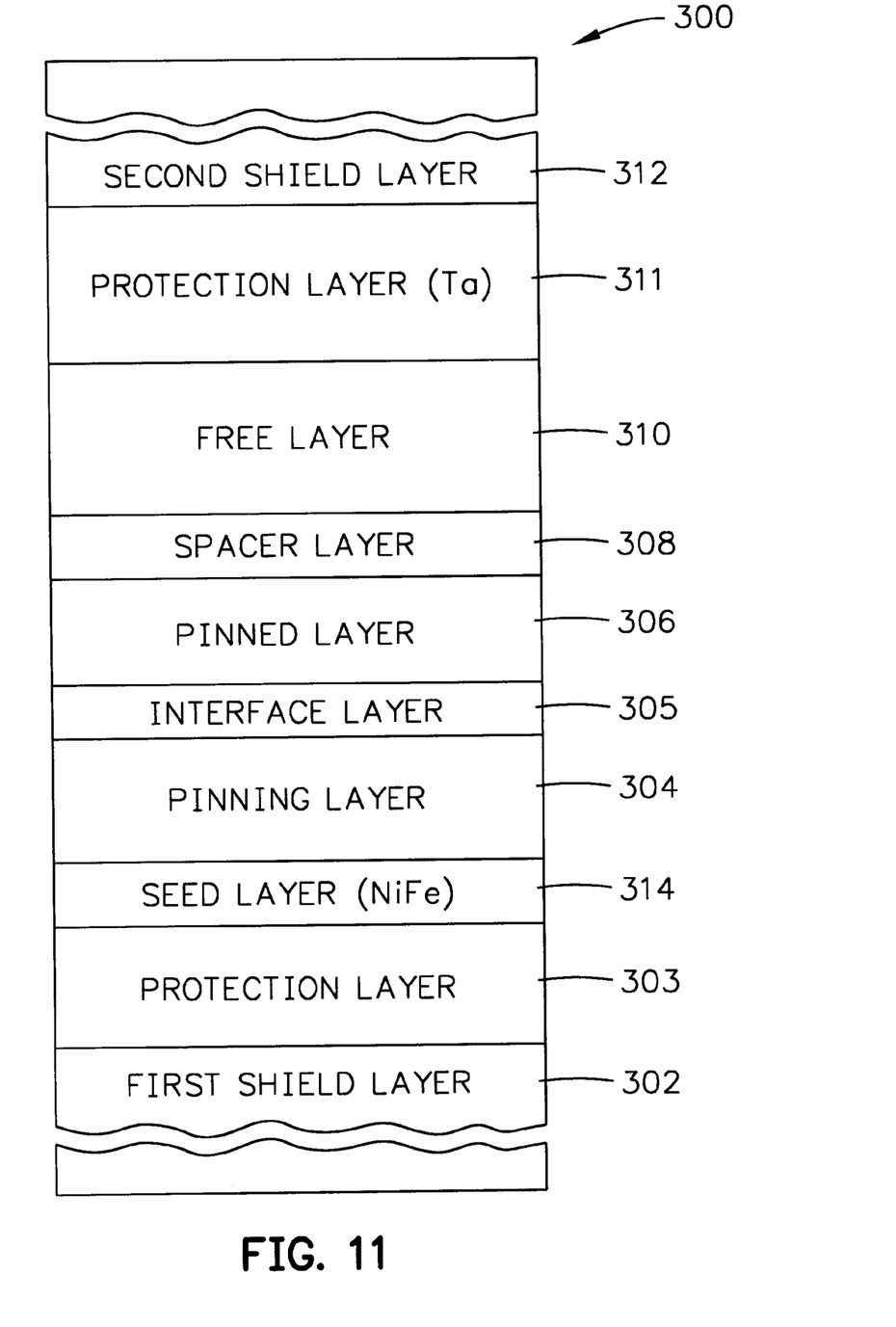
FIG. 11 is an ABS illustration of the preferred embodiment sensor of the present invention.

FIG. 11 shows the preferred embodiment of the tunnel junction sensor 300 of the present invention. This sensor 300 includes a first shield layer 302 made of Permalloy ($Ni_{80}Fe_{20}$). A protection layer 303 of tantalum (Ta), if necessary, having a thickness of 10–1000 Å, with a preferred thickness of 50 Å, and a seed layer 314 of nickel iron (NiFe), if necessary, having a thickness of 10–20 Å. Next is the antiferromagnetic pinning layer 304, made of manganese iron (MnFe), has a thickness range of 50–150 Å, preferably 100 Å. Other antiferromagnetic materials such as nickel manganese (NiMn), iridium manganese (IrMn) or platinum manganese (PtMn) may be used for the pinning layer 304. A thin interface layer 305, made of nickel iron (NiFe), is next with a thickness between 10–30 Å, preferably 20 Å. The reason for the interface layer 305 is that the antiferromagnetic pinning layer 304 has stronger exchange coupling with the NiFe interface layer 305 than with the FeN pinned layer 306. The pinned layer 306 is made from iron nitride (FeN) with a thickness of 20–50 Å, preferably 30 Å. The magnetization of the pinned layer 306 is normal to the ABS surface. Optionally, the pinned layer 306 may be made from nickel iron (NiFe), cobalt (Co) or cobalt iron (CoFe), in which case the interface layer 305 may be omitted. A spacer layer 308 is next, made of aluminum oxide, with a thickness of 10–30 Å, preferably 20 Å. The spacer layer 308 is followed by the free layer 310, made of iron nitride (FeN) with a thickness of 30–100 Å, preferably 50 Å. The magnetization of the free layer 310 is perpendicular to the pinned layer 306 and parallel to the ABS. A protection layer 311, made of Tantalum (Ta), if necessary, and having a thickness of 30–100 Å, preferably 50 Å, is placed between the free layer 310 and a second shield layer 312. The protection layers are used to protect the sensor from damage during subsequent processing and to isolate the sensor from the shields. The protection layers are also known as de-coupling layers. Depending on the processing, the protection layers may not be necessary. The first and second shields 302 and 312 are used as electrodes for the tunnel junction sensor 300. The inductive write head 70 is then formed on the tunnel junction read sensor 300 (or read head 72, see FIG. 6).

In the preferred embodiment the free layer employs a FeN ferromagnetic material that has a magnetization ($M_S$) from 1600 to 1800 emu/cc and a coercivity ($H_C$) from 1 to 5 Oe. Other suitable FeX ferromagnetic materials are iron zirconium nitride (FeZrN) and iron hafnium nitride (FeHfN).

Clearly, other embodiments and modifications of this invention will occur readily to those of ordinary skill in the art in view of these teachings. While the description of the tunnel junction sensor is described in relation to a magnetic disk drive read/write head, it should understood that in other applications, the tunnel junction sensor may be used alone or in combination with other devices. Therefore, the disclosed invention is to be considered merely illustrative and limited in scope only as specified in the appended claims.

What is claimed is:

1. A tunnel junction sensor that has an air bearing surface (ABS) comprising:
    an electrically conductive first shield layer;
    an electrically conductive antiferromagnetic pinning layer that has magnetic spins oriented in a first predetermined direction;
    an electrically conductive ferromagnetic alloy pinned layer exchange coupled to the pinning layer so that a magnetic moment of the pinned layer is pinned in the first predetermined direction;
    an electrically conductive ferromagnetic alloy free layer of iron nitride (FeN) that has a magnetic moment in a second predetermined direction, the second predetermined direction being substantially perpendicular to the first direction, the magnetic moment being free to rotate relative to the second predetermined direction in response to an applied magnetic field;
    an insulating spacer layer disposed between the pinned layer and the free layer; and
    an electrically conductive second shield layer.

2. A tunnel junction sensor as claimed in claim 1 wherein the first and second shield layers are used for electrical leads.

3. A tunnel junction sensor as claimed in claim 1 wherein the conductive antiferromagnetic pinning layer has a thickness from 50 Å to 150 Å.

4. A tunnel junction sensor as claimed in claim 3 wherein the conductive antiferromagnetic pinning layer is selected from the group MnFe, NiMn, IrMn and PtMn.

5. A tunnel junction sensor as claimed in claim 1 wherein the ferromagnetic alloy pinned layer has a thickness from 20 Å to 50 Å.

6. A tunnel junction sensor as claimed in claim 5 wherein the ferromagnetic alloy pinned layer is selected from the group PeN, Co and CoFe.

7. A tunnel junction sensor as claimed in claim 1 wherein the spacer layer has a thickness from 10 Å to 30 Å.

8. A tunnel junction sensor as claimed in claim 7 wherein the spacer layer is made from aluminum oxide.

9. A tunnel junction sensor as claimed in claim 1 wherein the ferromagnetic alloy free layer has a thickness from 30 Å to 100 Å.

10. A tunnel junction sensor as claimed in claim 1 wherein the first and second shields are made from Permalloy ($Ni_{80}Fe_{20}$).

11. A tunnel sensor as claimed in claim 1 further comprising;
    an interface layer positioned between the pinned layer and pinning layer, the interface layer exchanged coupled to the pinned layer and the pinning layer.

12. A tunnel junction sensor as claimed in claim 11 wherein the interface layer has a thickness from 10 Å to 30 Å.

13. A tunnel junction sensor as claimed in claim 12 wherein the interface layer is made from NiFe.

14. A tunnel sensor as claimed in claim 1 further comprising;
    a first protection layer positioned between the first shield layer and the pinning layer; and
    a second protection layer positioned between the second shield layer and the ferromagnetic alloy free layer.

15. A tunnel junction sensor as claimed in claim 14 wherein the first and second protection layers have a thickness from 30 Å to 100 Å.

16. A tunnel junction sensor as claimed in claim 15 wherein the first and second protection layers are made from Tantalum (Ta).

17. A magnetic head that has an air bearing surface (ABS) comprising:
a read head that includes:
a tunnel junction sensor responsive to applied magnetic fields;
first and second electrically conductive lead layers connected to the tunnel junction sensor for conducting a tunnel current through the tunnel junction sensor; the tunnel junction sensor including:
an electrically conductive first shield layer;
a conductive antiferromagnetic pinning layer that has a magnetic moment oriented in a first predetermined direction, the first predetermined direction being normal to the ABS;
an interface layer exchanged coupled to the pinning layer so that a magnetic moment of the interface layer is pinned in the first predetermined direction;
a ferromagnetic alloy pinned layer exchange coupled to the interface layer so that a magnetic moment of the pinned layer is pinned in the first predetermined direction;
a ferromagnetic alloy free layer of iron nitride (FeN) having a magnetic moment in a second predetermined direction, the second predetermined direction being perpendicular to the first predetermined direction, the magnetic moment being free to rotate relative to the second predetermined direction in response to an applied magnetic field;
an insulating spacer layer disposed between the pinned and free layers;
an electrically conductive second shield layer;
a write head including:
first and second pole piece layers and a write gap layer;
the first and second pole piece layers being separated by the write gap layer at the ABS and connected at a back gap that is recessed rearwardly in the head from the ABS;
an insulation stack having at least first and second insulation layers;
at least one coil layer embedded in the insulation stack; and
the insulation stack and the at least one coil layer being located between the first and second pole piece layers.

18. A magnetic head as claimed in claim 17 wherein the first and second electrically conductive lead layers are the electrically conductive first and second shield layers.

19. A magnetic head as claimed in claim 17 wherein the conductive antiferromagnetic pinning layer has a thickness from 50 Å to 150 Å.

20. A magnetic head as claimed in claim 19 wherein the conductive antiferromagnetic pinning layer is selected from the group MnFe, NiMn and IrMn.

21. A magnetic head as claimed in claim 17 wherein the ferromagnetic alloy pinned layer has a thickness from 20 Å to 50 Å.

22. A magnetic head as claimed in claim 21 wherein the ferromagnetic alloy pinned layer is selected from the group FeN, Co and CoFe.

23. A magnetic head as claimed in claim 17 wherein the spacer layer has a thickness from 10 Å to 30 Å.

24. A magnetic head as claimed in claim 23 wherein the spacer layer is made from aluminum oxide.

25. A magnetic head as claimed in claim 17 wherein the ferromagnetic alloy free layer has a thickness from 30 Å to 100 Å.

26. A magnetic head as claimed in claim 17 wherein the first and second shields are made from Permalloy ($Ni_{80}Fe_{20}$).

27. A magnetic head sensor as claimed in claim 17 wherein the interface layer has a thickness from 10 Å to 30 Å.

28. A magnetic head as claimed in claim 27 wherein the interface layer is made from NiFe.

29. A tunnel sensor as claimed in claim 17 further comprising;
a first protection layer positioned between the first shield layer and the pinning layer; and
a second protection layer positioned between the second shield layer and the ferromagnetic alloy free layer.

30. A magnetic head as claimed in claim 29 wherein the first and second protection layers are made from Tantalum (Ta).

31. A magnetic disk drive that includes at least one magnetic head that has an air bearing surface (ABS), the disk drive comprising:
the magnetic head including a combined read head and write head;
the read head including:
a tunnel junction sensor responsive to applied magnetic fields; and
first and second electrically conductive lead layers connected to the tunnel junction sensor for conducting a tunnel current through the tunnel junction sensor; the tunnel junction sensor including:
an electrically conductive first shield layer;
a conductive antiferromagnetic pinning layer that has a magnetic moment oriented in a first predetermined direction, the first predetermined direction being normal to the ABS;
an interface layer exchanged coupled to the pinning layer so that a magnetic moment of the interface layer is pinned in the first predetermined direction;
a ferromagnetic alloy pinned layer exchange coupled to the interface layer so that a magnetic moment of the pinned layer is pinned in the first predetermined direction;
a ferromagnetic alloy free layer of iron nitride (FeN) that has a magnetic moment in a second predetermined direction, the second predetermined direction being perpendicular to the first predetermined direction, the magnetic moment being free to rotate relative to the second predetermined direction in response to an applied magnetic field;
an insulating spacer layer disposed between the pinned and free layers; and
an electrically conductive second shield layer;
the write head including:
first and second pole piece layers and a write gap layer wherein the first pole piece layer and the second shield layer are a common layer;
the first and second pole piece layers being separated by the write gap layer at the ABS and connected at a back gap that is recessed rearwardly in the head from the ABS;
an insulation stack having at least first and second insulation layers;

at least one coil layer embedded in the insulation stack; and the insulation stack and the at least one coil layer being located between the first and second pole piece layers;

a housing;

a magnetic disk rotatably supported in the housing;

a support mounted in the housing for supporting the magnetic head with its ABS facing the magnetic disk so that the magnetic head is in a transducing relationship with the magnetic disk;

means for rotating the magnetic disk;

positioning means connected to the support for moving the magnetic head to multiple positions with respect to said magnetic disk; and processing means connected to the magnetic head, to the means for rotating the magnetic disk and to the positioning means for exchanging signals with the merged magnetic head, for controlling movement of the magnetic disk and for controlling the position of the magnetic head.

32. A magnetic disk drive as claimed in claim 31 wherein the processing means is connected to the first and second leads for applying the tunnel current to the sensor.

33. A magnetic disk drive as claimed in claim 32 wherein the processing means applies said tunnel current.

34. A magnetic disk drive as claimed in claim 31 wherein the first and second electrically conductive lead layers are the electrically conductive first and second shield layers.

35. A magnetic disk drive as claimed in claim 31 wherein the conductive antiferromagnetic pinning layer has a thickness from 50 Å to 150 Å.

36. A magnetic disk drive as claimed in claim 35 wherein the conductive antiferromagnetic pinning layer is selected from the group MnFe, NiMn and IrMn.

37. A magnetic disk drive as claimed in claim 31 wherein the ferromagnetic alloy pinned layer has a thickness from 20 Å to 50 Å.

38. A magnetic disk drive as claimed in claim 37 wherein the ferromagnetic alloy pinned layer is selected from the group FeN, Co and CoFe.

39. A magnetic disk drive as claimed in claim 31 wherein the spacer layer has a thickness from 10 Å to 30 Å.

40. A magnetic disk drive as claimed in claim 39 wherein the spacer layer is made from aluminum oxide.

41. A magnetic disk drive as claimed in claim 31 wherein the ferromagnetic alloy free layer has a thickness from 30 Å to 100 Å.

42. A magnetic disk drive as claimed in claim 31 wherein the first and second shields are made from Permalloy ($Ni_{80}Fe_{20}$).

43. A magnetic disk drive as claimed in claim 31 wherein the interface layer has a thickness from 10 Å to 30 Å.

44. A magnetic disk drive as claimed in claim 43 wherein the interface layer is made from NiFe.

45. A tunnel sensor as claimed in claim 31 further comprising;

a first protection layer positioned between the first shield layer and the pinning layer; and a second protection layer positioned between the second shield layer and the ferromagnetic alloy free layer.

46. A magnetic disk drive as claimed in claim 45 wherein the first and second protection layers are made from Tantalum (Ta).

47. A method of making a tunnel junction sensor that has an air bearing surface (ABS) comprising:

forming a first shield layer from conductive material;

forming a conductive antiferromagnetic pinning layer on the first shield layer, the pinning layer having a magnetic moment oriented in a first predetermined direction on the first shield layer, the first predetermined direction being normal to the ABS;

forming an interface layer exchanged coupled to the pinning layer so that a magnetic moment of the interface layer is pinned in the first predetermined direction;

forming a ferromagnetic alloy pinned layer exchange coupled to the interface layer so that a magnetic moment of the pinned layer is pinned in the first predetermined direction;

forming an insulating spacer layer on the pinned layer;

forming a ferromagnetic alloy free layer of iron nitride (FeN) on the spacer layer, the free layer having a magnetic moment in a second predetermined direction on the spacer layer, the second predetermined direction being perpendicular to the first predetermined direction, the magnetic moment being free to rotate relative to the second predetermined direction in response to an applied magnetic field; and forming an electrically conductive second shield layer on the free layer.

48. A method as claimed in claim 47 wherein the conductive antiferromagnetic pinning layer has a thickness from 50 Å to 150 Å.

49. A method as claimed in claim 48 wherein the conductive antiferromagnetic pinning layer is selected from the group MnFe, NiMn and IrMn.

50. A method as claimed in claim 47 wherein the ferromagnetic alloy pinned layer has a thickness from 20 Å to 50 Å.

51. A method as claimed in claim 50 wherein the ferromagnetic alloy pinned layer is selected from the group FeN, Co and CoFe.

52. A method as claimed in claim 47 wherein the spacer layer has a thickness from 10 Å to 30 Å.

53. A method as claimed in claim 52 wherein the spacer layer is made from aluminum oxide.

54. A method as claimed in claim 47 wherein the ferromagnetic alloy free layer has a thickness from 30 Å to 100 Å.

55. A method as claimed in claim 47 wherein the first and second shields are made from Permalloy ($Ni_{80}Fe_{20}$).

56. A method as claimed in claim 47 wherein the interface layer has a thickness from 10 Å to 30 Å.

57. A method as claimed in claim 56 wherein the interface layer is made from NiFe.

58. A tunnel sensor as claimed in claim 47 further comprising;

a first protection layer positioned between the first shield layer and the pinning layer; and a second protection layer positioned between the second shield layer and the ferromagnetic alloy free layer.

59. A method as claimed in claim 58 wherein the first and second protection layers are made from Tantalum (Ta).

60. A method of making a magnetic head that has an air bearing surface (ABS) comprising:

forming a tunnel read head that includes:

forming a first shield layer from conductive material;

forming a conductive antiferromagnetic pinning layer on the first shield layer, the pinning layer having a magnetic moment oriented in a first predetermined direction, the first predetermined direction being normal to the ABS;

forming an interface layer exchanged coupled to the pinning layer so that a magnetic moment of the interface layer is pinned in the first predetermined direction;

forming a ferromagnetic alloy pinned layer exchange coupled to the interface layer so that a magnetic moment of the pinned layer is pinned in the first predetermined direction;

forming an insulating spacer layer on the pinned layer;

forming a ferromagnetic alloy free layer of iron nitride (FeN) on the spacer layer, the free layer having a magnetic moment in a second predetermined direction, the second predetermined direction being perpendicular to the first predetermined direction, the magnetic moment being free to rotate relative to the second predetermined direction in response to an applied magnetic field; and forming an electrically conductive second shield layer on the free layer.

61. A method as claimed in claim 60 including:

forming a write head as follows:
   forming a write gap layer and an insulation stack with a coil layer embedded therein on the second shield layer so that the second shield layer also functions as a first pole piece for the write head; and
   forming a second pole piece layer on the insulation stack and the write gap and connected at a back gap to the first pole piece.

62. A method as claimed in claim 60 wherein the conductive antiferromagnetic pinning layer has a thickness from 50 Å to 150 Å.

63. A method as claimed in claim 62 wherein the conductive antiferromagnetic pinning layer is selected from the group MnFe, NiMn and IrMn.

64. A method as claimed in claim 60 wherein the ferromagnetic alloy pinned layer has a thickness from 20 Å to 50 Å.

65. A method as claimed in claim 64 wherein the ferromagnetic alloy pinned layer is selected from the group FeN, Co and CoFe.

66. A method as claimed in claim 60 wherein the spacer layer has a thickness from 10 Å to 30 Å.

67. A method as claimed in claim 66 wherein the spacer layer is made from aluminum oxide.

68. A method as claimed in claim 60 wherein the ferromagnetic alloy free layer has a thickness from 30 Å to 100 Å.

69. A method as claimed in claim 60 wherein the first and second shields are made from Permalloy ($Ni_{80}Fe_{20}$).

70. A method as claimed in claim 60 wherein the interface layer has a thickness from 10 Å to 30 Å.

71. A method as claimed in claim 70 wherein the interface layer is made from NiFe.

72. A tunnel sensor as claimed in claim 60 further comprising;
   a first protection layer positioned between the first shield layer and the pinning layer; and
   a second protection layer positioned between the second shield layer and the ferromagnetic alloy free layer.

73. A method as claimed in claim 72 wherein the first and second protection layers are made from Tantalum (Ta).

* * * * *